US009335395B2

(12) United States Patent
De Oliveira et al.

(10) Patent No.: US 9,335,395 B2
(45) Date of Patent: May 10, 2016

(54) MAGNETIC RESONANCE SYSTEM AND METHOD FOR FREQUENCY CALIBRATION OF THE MAGNETIC RESONANCE SYSTEM

(75) Inventors: Andre De Oliveira, Erlangen (DE); Christian Geppert, Hoboken, NJ (US)

(73) Assignee: Siemens Aktiengesellschaft, Munich (DE)

( * ) Notice: Subject to any disclaimer, the term of this patent is extended or adjusted under 35 U.S.C. 154(b) by 905 days.

(21) Appl. No.: 13/541,194

(22) Filed: Jul. 3, 2012

(65) Prior Publication Data

US 2013/0088231 A1   Apr. 11, 2013

(30) Foreign Application Priority Data

Jul. 8, 2011  (DE) .......................... 10 2011 078 868

(51) Int. Cl.
*G01V 3/00* (2006.01)
*G01R 33/58* (2006.01)
*G01R 33/44* (2006.01)

(52) U.S. Cl.
CPC .............. *G01R 33/58* (2013.01); *G01R 33/583* (2013.01); *G01R 33/448* (2013.01)

(58) Field of Classification Search
CPC ........................................................ G01R 33/58
USPC ............................ 324/307, 309, 318, 322, 300
See application file for complete search history.

(56) References Cited

U.S. PATENT DOCUMENTS

| 5,309,102 | A |  | 5/1994 | Deckard |  |
|---|---|---|---|---|---|
| 5,481,190 | A |  | 1/1996 | Sugiura |  |
| 5,912,558 | A |  | 6/1999 | Halamek et al. |  |
| 7,026,814 | B2 | * | 4/2006 | Bordon et al. | ................. 324/303 |
| 8,115,485 | B1 | * | 2/2012 | Maier et al. | ................... 324/318 |
| 8,242,779 | B2 |  | 8/2012 | Blumich et al. |  |
| 9,035,652 | B2 | * | 5/2015 | Nishihara et al. | ............. 324/309 |

FOREIGN PATENT DOCUMENTS

| JP | H10107746 A | 4/1998 |
|---|---|---|
| JP | H 11142354 A | 5/1999 |

OTHER PUBLICATIONS

Dowell et al. Fast, Accurate, and Precise Mapping of the RG Field In Vivo Using the 180° Signal Null, Magnetic Resonance in Medicine, vol. 58 (2007 pp. 622-630.
Franconi et al. Quantitative metabolite T2 measurements with a multi-echo PRESS sequence, p. 1194, Proceedings International Society for Magnetic Resonance in Medicine, 4th Annual Meeting.
Edden et al: "Longitudinal and Multi-Echo Transverse Relaxation Times of Normal Breast Tissue at 3 Tesla", Journal of Magnetic Resonance Imaging vol. 32: pp. 982-987 (2010).
Pineda et al. Measurement of Hepatic Lipid, pp. 568-576, Radiology, vol. 252; Nr. 2; Aug. 2009.
Rakow-Penner et al: "Relaxation Times of Breast Tissue at 1.5T and 3T Measured Using IDEAL", Journal of Magnetic Resonance Imaging vol. 23: pp. 87-91 (2006).

* cited by examiner

*Primary Examiner* — Louis Arana
(74) *Attorney, Agent, or Firm* — Schiff Hardin LLP

(57) ABSTRACT

In a method for frequency calibration in a magnetic resonance system in a volume section containing an unknown number of determined substances, the predetermined volume section is excited with RF pulses and subsequent echo signals are recorded at different times and spectral information is determined for each of the echo signals, from which a peak value in the spectral information and an associated relaxation time are determined. Dependent on the relaxation time, a substance is determined for each peak value. A frequency adjustment substance dependent of the magnetic resonance system is then implemented. Multiple peak values in the spectral information of the echo signals can be determined.

14 Claims, 3 Drawing Sheets

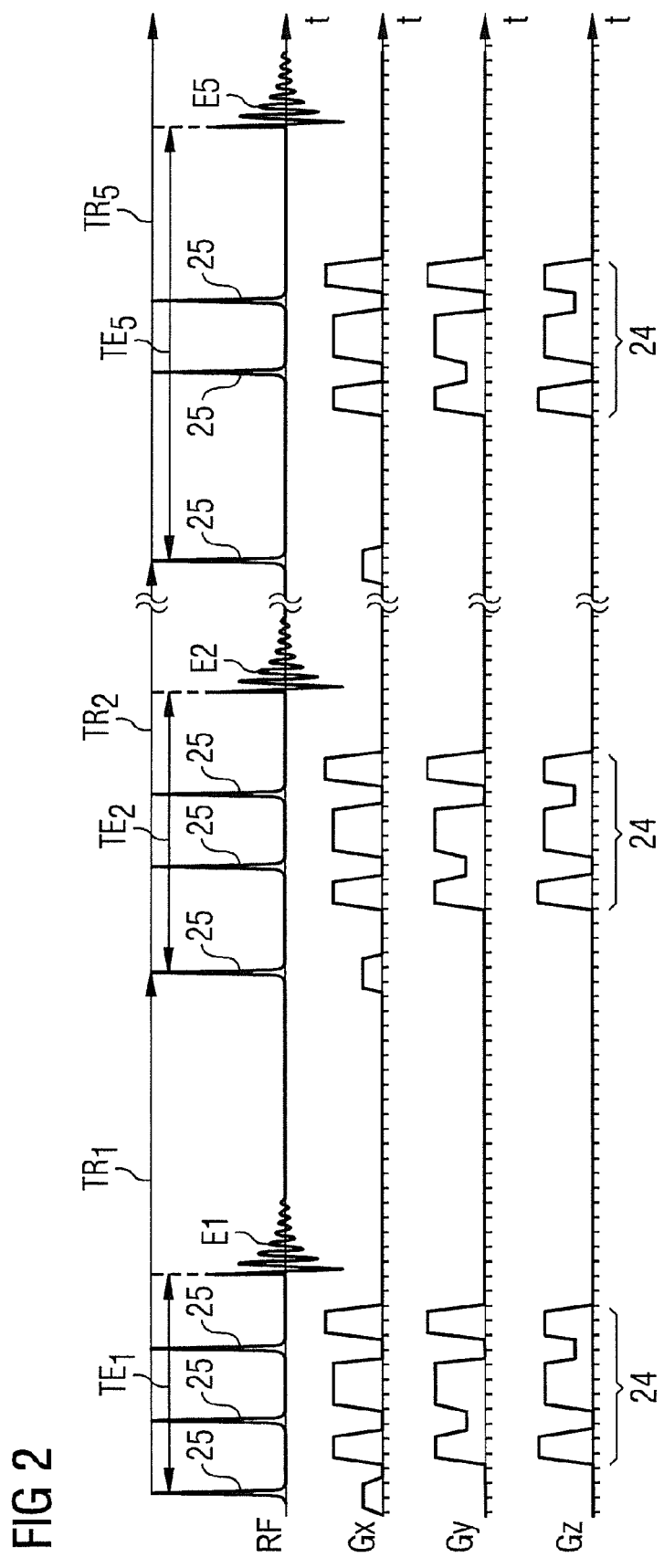

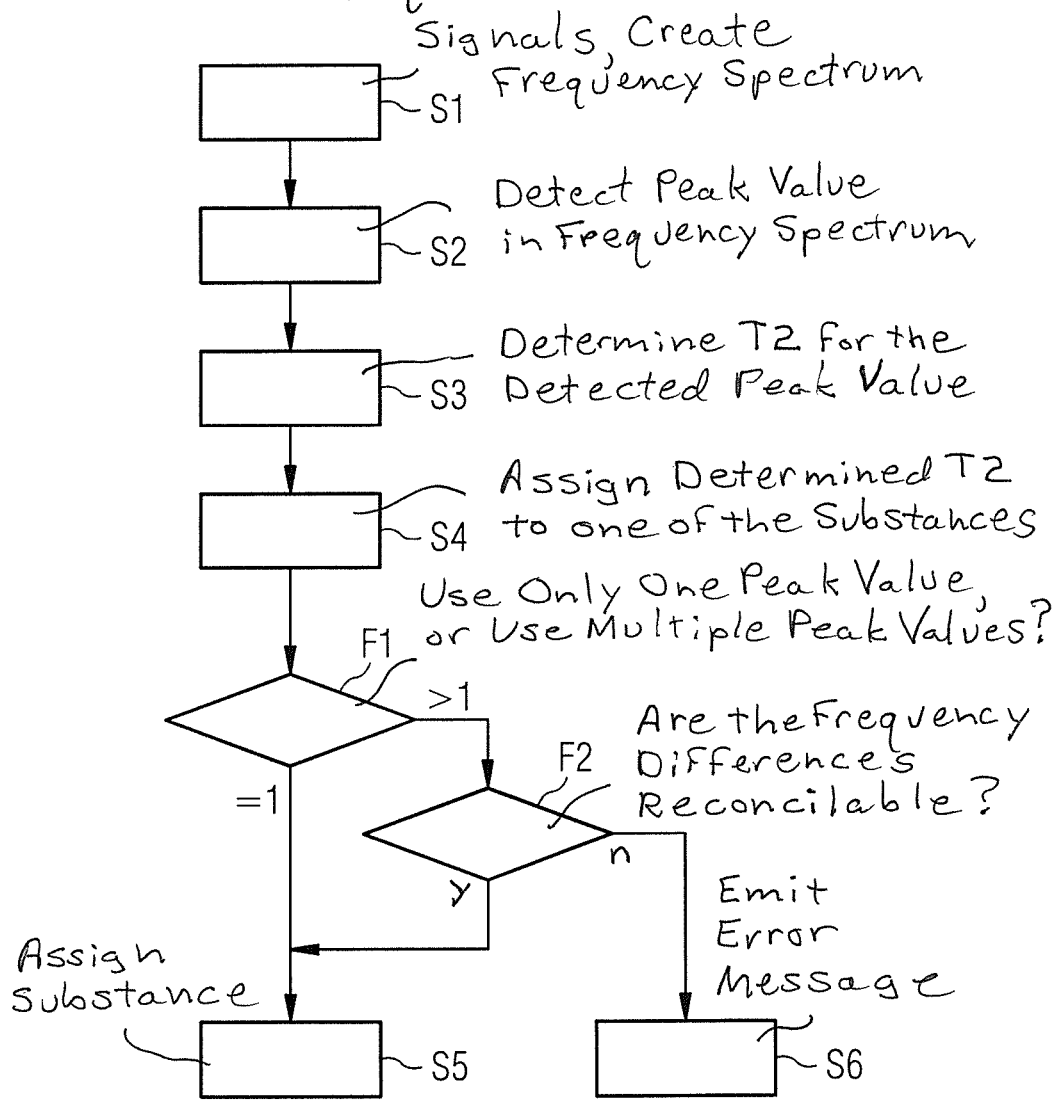

MAGNETIC RESONANCE SYSTEM AND METHOD FOR FREQUENCY CALIBRATION OF THE MAGNETIC RESONANCE SYSTEM

BACKGROUND OF THE INVENTION

1. Field of the Invention

The present invention relates to a method for frequency calibration or frequency adjustment as well as a correspondingly designed magnetic resonance system.

2. Description of the Prior Art

In magnetic resonance tomography, system calibration or frequency calibration is one of the first steps to be carried out prior to the actual MR measurement (diagnostic data acquisition). In general, it is assumed that water supplies the highest peak value in a frequency spectrum created in the system calibration, so that the systems according to the state of the art record only the highest peak value and assign that value to the resonance frequency of the water. In some applications, for example magnetic resonance tomography of the female breast, however, water may not exhibit the highest peak value since, for example, fat or silicone generate a higher peak value, which then leads to a faulty frequency calibration.

SUMMARY OF THE INVENTION

An object of the present invention is to provide a magnetic resonance system and an operating method therefore for carrying out correct frequency calibration even in such cases, i.e. cases in which it is not previously known which of several predetermined substances will be detected in the frequency spectrum.

Within the scope of the present invention, a method is provided for frequency calibration for a magnetic resonance system.

Nuclear spins in a predetermined volume section of a subject are excited, that contain an unknown number of predetermined substances, with RF pulses. (The volume section can contain (mainly) one substance or several substances, i.e. the number is greater than 0).

Multiple echo signals are acquired (detected) at different times after the respective excitation. It is possible for echo signals to be recorded proceeding from an RF excitation at different times after the same RF excitation. However, it is also possible for an echo signal to be recorded in an interval after an RF excitation and for an additional echo signal to be recorded in an interval after a further RF excitation.

Each of the recorded echo signals is (as a rule by means of a Fourier transformation) converted into respective spectral information (i.e. in a frequency spectrum).

Within each item of this spectral information or frequency spectra one or more peak values are determined. In the process a peak value is, for example, characterized by the amplitude at the frequency of the peak value being greater by a predetermined amount (e.g. 5) than the average amplitude over the spectrum.

A relaxation time is determined for each peak value. To this end, for example, the respective peak value is determined in each created frequency spectrum and the relaxation time is determined with the help of the decreasing amplitude of the peak value. The frequency spectra are sorted previously dependent on the time span when the respective echo signal was recorded after the RF excitation, so that the amplitude of the respective peak value in the nth frequency spectrum is greater than the amplitude of the respective peak value in the (n+1)th frequency spectrum.

Using the relaxation time, which is determined for each peak value, the corresponding substance can then be determined from the quantity of the predetermined substances so that each peak value is assigned to a substance. The frequency measured for the respective peak value in the process corresponds to the resonance frequency of the respective substance determined for this peak value. The assignment of the respective peak value to the substance can for example be performed proceeding from a time range which is known for each predetermined substance and specifies the range in which the relaxation times of the respective substance lie. If the measured relaxation time lies within the respective range then the peak value for which the relaxation time is specified will be assigned to this substance.

Depending on the resonance frequency or frequencies which were measured for the substance or substances, an instrument based frequency adjustment is then carried out for the transmitter and receiver of the magnetic resonance system.

In accordance with the invention, frequency calibration is understood as being a measurement or determination of the resonance frequency for each predetermined substance and an instrument-based frequency adjustment carried out depending on such determined resonance frequencies with respect to the transmitting antennae and receiving antennae of the magnetic resonance system.

Since the inventive method assigns the respective substance to the respective peak value with the use of the relaxation time, in accordance with the invention each peak value in the frequency spectrum can automatically (without user specifications) be assigned to a substance from a predefined quantity of substances. Therefore, the frequency calibration can also be performed advantageously when not water but rather fat or silicone or a combination of these signals is present in the frequency spectrum.

If not just one peak value, but rather several peak values are recorded in the spectral information of the echo signals, the determination of the respective substance per peak value can also be carried out dependent on a resonance frequency difference on the basis of the chemical shift.

Due to the chemical shift, the resonance frequency of water differs, for example, by 3.3 ppm from the resonance frequency of fat. By performing the assignment of the respective substances to the respective peak values in dependence on the known chemical shift, i.e. the resonance frequency difference between two substances from the quantity of the predetermined substances, the quality of the assignment can be advantageously improved in comparison to an inventive method which performs this assignment solely via the relaxation time.

Within the scope of the present invention, a further method for frequency calibration of a magnetic resonance system is provided. The further inventive method includes the following steps.

Nuclear spins in a predetermined volume section of a subject are excited, that contains an unknown number of predetermined substances, with RF pulses.

Multiple echo signals are acquired at different time spans after the RF excitation.

Each recorded echo signal is converted into respective spectral information or into a respective frequency spectrum.

In each of these frequency spectra several peak values are determined.

Depending on resonance frequency differences on the basis of the chemical shift which are known for the predetermined substances, for each peak value one substance is determined from the quantity of predetermined substances. For example, if the difference between the measured frequencies for two of the recorded peak values (resonance frequencies) corresponds to a known resonance frequency difference for the predetermined substances, then these two peak values are assigned to the corresponding substances.

Dependent on the measured resonance frequencies of those substances that are determined for the respective peak values, the instrument based frequency adjustment is carried out.

According to this inventive method, proceeding from one or more peak values in the frequency spectrum, the relaxation time is used to determine the respective substance that belongs to the respective peak value. The further inventive method proceeds from several peak values and uses the resonance frequency difference to determine the respective substance that belongs to the respective peak value. Since a resonance frequency difference can only be formed in the case of at least two substances, the further inventive method can be employed only when at least two peak values are recorded in the respective frequency spectra. Similar to the inventive method the further inventive method is advantageously capable of automatically assigning peak values in the frequency spectrum to the respective substances, in order then to be able to carry out the frequency calibration dependent on the resonance frequencies determined for the respective substances.

Both the inventive method and the further inventive method can assign a peak value to only one substance that is included in a predefined quantity of predetermined substances. While, depending on the magnetic field strength in particular one region is known in which the relaxation time of the respective substance lies for each substance of this quantity for the inventive method, for the further inventive method for each substance at least the resonance frequency difference to a resonance frequency of another substance is known.

In the case of the two inventive methods the frequency calibration takes place dependent on the resonance frequency of at least one substance measured in accordance with the invention. The knowledge of this resonance frequency makes it possible to calibrate both the transmitting antennae as well as also the receiving antennae with reference to this resonance frequency or Larmor frequency so that for example by means of a local coding also the desired volume section (and not an adjacent volume section) is recorded.

In accordance with a preferred embodiment of each of the two inventive methods a multi echo STEAM sequence ("Stimulated Echo Acquisition Mode") is employed to excite the predetermined volume section and to record the echo signals. This sequence is known e.g. from "Measurement of Hepatic Lipid" by N. Pineda et alia, pages 568-576, Radiology; Vol. 252; No. 2; August 2009. In a further inventive embodiment instead of a multi-echo STEAM sequence, a multi-echo PRESS sequence (90°-180°-180°) (Point RESolved Spectroscopy") is employed, which, for example, is known from "Quantitative metabolite T2 measurements with a multi-echo PRESS sequence, by F. Franconi et alia, page 1194, Proceedings International Society for Magnetic Resonance in Medicine, 4th Annual Meeting.

In accordance with a further preferred embodiment of each of the two inventive methods, the peak value or peak values are determined with the RF pulse in the spectral information of the first echo signal after the excitation. In other words the echo signal that is recorded with the shortest time lag after the RF excitation is determined. The peak value or peak values are determined in the first spectral information (frequency spectrum), which was created from the first echo signal by means of Fourier transformation. For each peak value a frequency is determined in this first spectral information item. In the spectral information that was created for the other echo signals, then the peak value or peak values are sought at the respective frequency at which they occur in the first spectral information item.

The determination of the peak value or peak values in the first spectral information item (i.e. in the spectral information item that is created proceeding from the first echo signal) exhibits the advantage that the amplitude of the peak value or peak values in the first spectral information item is greater than in the other spectral information items, so that the peak value or peak values can be recorded more easily.

Both in the case of the inventive method as well as in the case of the further inventive method, the known substances can be water, fat and silicone.

In accordance with a further embodiment of each of the two inventive methods, the steps of the method can, with the exception of the carrying out of the frequency calibration, each be executed for several volume sections. Thus, each of these volume sections is excited with RF pulses, several echo signals are recorded and converted into respective spectral information items, one or more peak values are recorded in each item of spectral information and one substance per peak value is determined via known relaxation times and/or resonance frequency differences. If, in the case of this embodiment the same substance is recorded in several of the volume sections, the frequency of this substance is determined by determining a mean value of the frequencies that are determined in the respective volume sections for this substance. If, however, a substance is recorded only in one volume section, the frequency of this substance corresponds to the frequency that is determined for the substance in this volume section. The frequency calibration takes place in accordance with this embodiment dependent on the corresponding determined resonance frequency or frequencies.

This inventive embodiment is particularly useful when the volume section contains different substances. For example, in the case of magnetic resonance tomography of the female breast, from time to time it has been the case that a silicone implant is only in one breast. In this case it is advantageous for the resonance frequencies to be determined separately for each breast with the inventive method and/or with the further inventive method, since a silicone peak value can occur only in the breast provided with the silicone implant.

If, in other words, in magnetic resonance tomography of the female breast both breasts are mapped with the same MR measurement it is nevertheless advantageous to carry out the recording of the peak values and the assignment to the substances for a first predetermined volume section (e.g. right breast) and for a second predetermined volume section (e.g. breast) separately and then merge the results (i.e. the measured frequencies) by averaging for the frequency calibration of the actual MR measurement.

Within the scope of the present invention a magnetic resonance system for the creation of MR images of an examination object is also provided. The magnetic resonance system has a basic field magnet, a gradient field system, at least one RF antenna and a control device with which the gradient field system and the one or more RF antennae are controlled, from which signals picked up by the RF antennae are received and evaluated and MR images are created from them. The magnetic resonance system excites a predetermined volume section of the examination object with RF pulses generated by the RF antenna or antennae and with the help of the RF antenna or antennae records several echo signals at different times after the excitation. For each of these echo signals the control device determines a respective spectral information item or a respective frequency spectrum. In each of these spectral information items the control device records one or more peak values and determines the relaxation time for each of these peak values. Depending on the relaxation time determined for the respective peak value the control device determines a substance from a predetermined quantity of substances. Depending on the resonance frequencies recorded for one or more substances the magnetic resonance system then carries out an instrument-based frequency adjustment.

Within the scope of the present invention a further inventive magnetic resonance system is provided for the creation of MR images of an examination object. The further magnetic resonance system also has a basic field magnet, a gradient field system, an RF antenna and a control device in order to control the gradient field system and the RF antenna, receive and evaluate the signals picked up by the RF antenna and proceeding from these signals create the MR images. The further magnetic resonance system excites a predetermined volume section by generating RF pulses with the help of the RF antenna and irradiates into the predetermined volume section. Likewise with the help of the RF antenna the further magnetic resonance system records several echo signals at different times after the respective excitation. By means of the control device each of the echo signals is converted into a respective spectral information item and several peak values in the respective spectral information item are recorded. Per peak value the control device determines a substance in dependence of at least one resonance frequency difference of specified substances on the basis of the chemical shift. Depending on the resonance frequencies recorded for the substances the further magnetic resonance system then carries out an instrument based frequency adjustment.

The advantages of the inventive magnetic resonance system and the further inventive magnetic resonance system correspond essentially to the advantages of the two inventive methods that were previously described in detail.

The above objects also are achieved in accordance with the present invention by a non-transitory, computer-readable data storage medium encoded with programming instructions. When this data storage medium is loaded into a control and evaluation system of a magnetic resonance system, the programming instructions cause the control and evaluation system to operate the magnetic resonance system to execute any or all of the above-described embodiments of the method according to the invention.

The programming instructions or commands can be in source code (e.g. C++), that still has to be compiled (translated) and linked or that only has to be interpreted, or can be in a software code that only has to be loaded into the corresponding processing unit for execution.

The present invention exhibits the following advantages:
The robustness and reliability of MR measurements are improved by automatically assigning the peak values to specified substances (e.g. water, fat and/or silicone).
MR measurements can be accelerated by avoiding user errors that make a repetition of the measurements necessary.
The complexity of specified MR measurements, for example of MR measurements of the female breast, is reduced by reducing the scope of the parameters that can be set by the user.

The present invention is in particular suitable for the frequency calibration of magnetic resonance systems. Of course the present invention is not restricted to this preferred scope of application, since the present invention could in principle also be used for the determination of a resonance frequency (without subsequent instrument based frequency adjustment).

BRIEF DESCRIPTION OF THE DRAWINGS

FIG. 2 shows a pulse sequence diagram of a multi-echo STEAM sequence.
FIG. 3 shows a flow chart of an inventive method.

DESCRIPTION OF THE PREFERRED EMBODIMENTS

Figure 1:
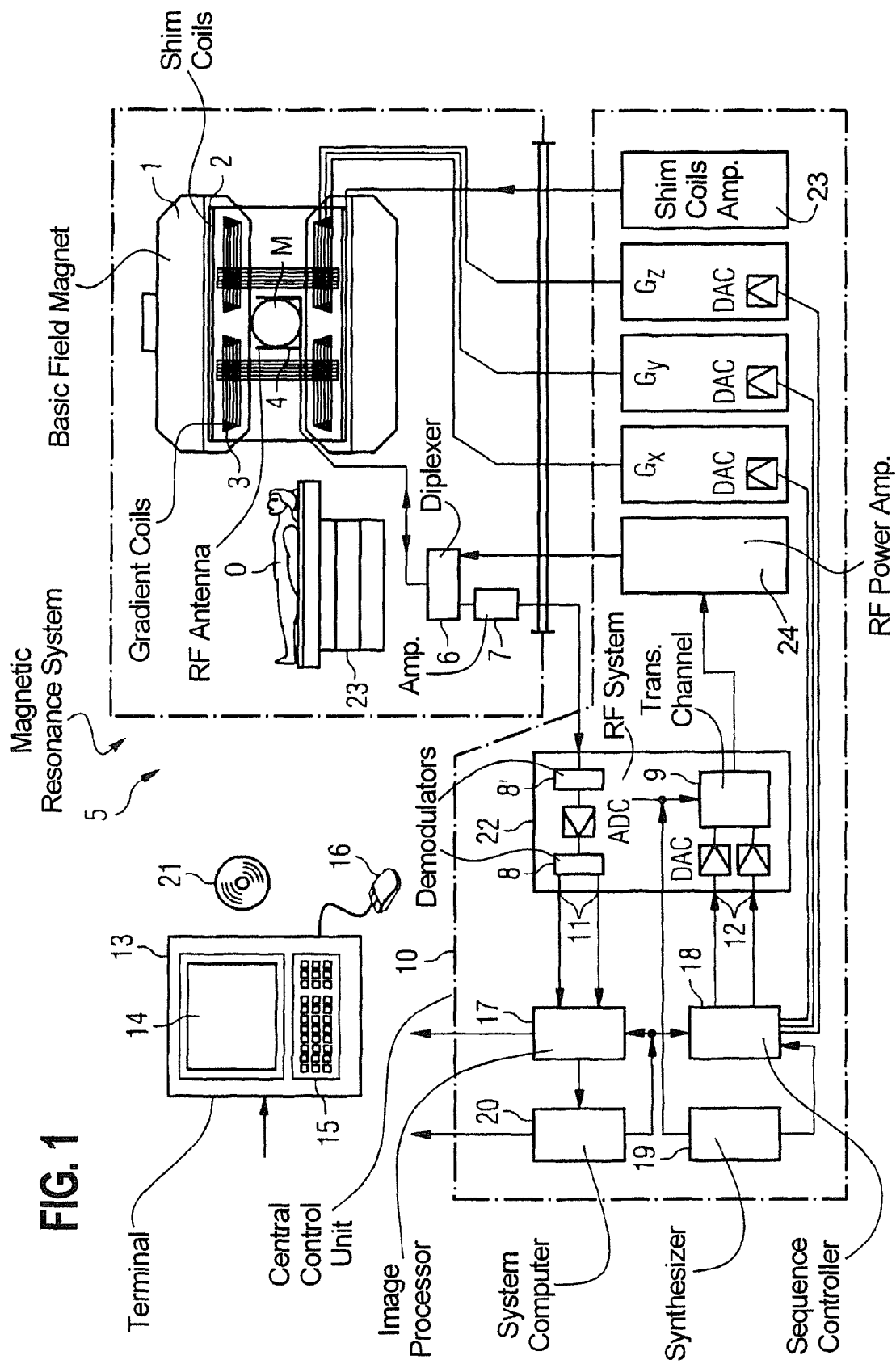
FIG. 1 schematically illustrates an inventive magnetic resonance system.

FIG. 1 shows a schematic representation of a magnetic resonance system 5 (a magnetic resonance imaging device or nuclear spin tomography device). In the process a fundamental magnetic field 1 generates a temporally constant strong magnetic field for polarization or for alignment of the nuclear spins in a region under examination of an object O, such as for example a part of a human body to be examined (e.g. of the breast region), said part being shifted on a table 23 lying in the magnetic resonance system 5. The high homogeneity of the basic magnetic field required for magnetic resonance tomography is defined in a typically spherical measurement volume M. For support of the homogeneity requirements and in particular for the elimination of time invariable influences so-called shim sheets made of ferromagnetic material are mounted on a suitable place. Time variable influences are eliminated by shim coils 2 supplied with signals from a shim coils supply 23.

A cylindrical gradient coil system 3 is inserted into the basic field magnet 1, the gradient coil system 3 being composed of three windings. Each winding is provided with power by a respective amplifier for the generation of a linear (also time modifiable) gradient field in the respective direction of the Cartesian coordinate system. The first winding of the gradient field system 3 generates a gradient $G_x$ in the x-direction, the second winding generates a gradient $G_y$ in the y-direction and the third winding generates a gradient $G_z$ in the z-direction. Each amplifier has a digital-analog converter that is controlled by a sequence control system 18 for the generation of gradient pulses at the correct time.

Within the gradient field system 3 there is one (or more) radio-frequency antennae 4 that convert the radio-frequency pulses emitted by a radio frequency power amplifier 24 to a magnetic AC field for excitation of the cores and alignment of the nuclear spin of the object O to be examined or of the region to be examined of the object O. Each radio-frequency antenna 4 is composed of one or more RF transmission coils and one or more RF reception coils in the shape of an annular, preferably linear or matrix-shaped arrangement of component coils. From the RF reception coils of the respective radio-frequency antenna 4 the AC field proceeding from the processing nuclear spin, i.e. as a rule the nuclear spin echo signals generated from a pulse sequence of one or more radio-frequency pulses and one or more gradient pulses, is also converted into a voltage (measurement signal) that is fed via an amplifier 7 to a radio-frequency receive channel 8 of a radio-frequency system 22. The radio-frequency system 22 additionally has one or more transmission channels 9 in which the radio-frequency pulses are generated for the excitation of the nuclear magnetic resonance. The respective radio-frequency pulses are digitally represented as a sequence of complex numbers on the basis of a pulse sequence in the sequence control system 18 predefined by the system computer 20. This number sequence is fed as a real part and as an imaginary part via inputs 12 to a digital analog converter in the radio-frequency system 22 and from the system 22 to a transmission channel 9. In the transmission channel 9 the pulse sequences are modulated to a radio-frequency carrier signal whose basic frequency corresponds to the resonance frequency of the nuclear spin in the measurement volume.

The switchover from send-receive mode occurs via a diplexer 6. The RF transmission coils of the radio-frequency antenna(e) 4 irradiate the radio-frequency pulses for excitation of the nuclear spin to the measurement volume M and resulting echo signals are scanned by the RF reception coil(s). The obtained nuclear resonance signals are phase-sensitively demodulated in the receive channel 8' (first demodulator) of the radio-frequency system 22 to an intermediate frequency and digitized in the analog-digital converter (ADC). This signal is also demodulated to the base frequency. The demodulation to the base frequency and the separation into real and imaginary parts at outputs 13 takes place after the digitization in the digital domain in a second demodulator 8. An image processor 17 reconstructs an MR image from the measurement data obtained in such a way. The administration of the measurement data, the image data and of the control programs occurs via a system computer 20. On the basis of a specification with control programs the sequence control system 18 controls the generation of the respective desired pulse sequences and the corresponding scanning of the k-space.

The sequence control system 18 controls the switching of the gradients at the correct time, the transmission of the radio-frequency pulses with defined phase amplitude as well as the reception of the nuclear resonance signals. The time base for the radio-frequency system 22 and the sequence control system 18 are made available by a synthesizer 19. The selection of corresponding control programs for the generation of an MR image, the control programs being e.g. stored on a DVD 21, as well as the representation of the generated MR image, occurs via a terminal 13 having a keyboard 15, a mouse 16 and a monitor 14.

In FIG. 2 a pulse sequence diagram of a multi-echo-STEAM implementation is shown. In the process each of the five repetitions is a modified STEAM sequence, which comprises three RF pulses 25, wherein the time lag of the two rear or chronologically last RF pulses 25 e.g. amounts to 10 ms. Within the scope of each STEAM sequence or each STEAM module a stimulated echo signal $E_1$ through $E_5$ is measured. The first echo time $TE_1$ (in the case of the first STEAM module) for example amounts to $TE_1=12$ ms, wherein $TE_2=24$ ms, $TE_3=36$, $TE_4=48$ and $TE_5=72$ ms. In the process the echo time TE indicates the time lag between the respective first RF pulse 25 and the time from which the respective echo signal $E_1$ through $E_5$ is measured. The repetition time TR, which specifies the interval between the beginning of a STEAM module and the beginning of the subsequent STEAM module, for example amounts to 3 s.

In the case of the multi-echo STEAM sequence the spatial resolution occurs by successive selective excitation of three orthogonal slices. The target volume is defined by the intersection volume of these three slices. Only the magnetization of the target volume experiences all three selective RF pulses 25 and hence contributes to the stimulated echo. One obtains the spectra of the target volume for example by a one-dimensional Fourier transformation of the time signals $E_1$ through $E_5$ corresponding to the stimulated echo. The interesting stimulated echo reaches maximum at a 90°-90°-90° or 90°-180°-180° RF excitation sequence 25. The complete dephasing of all undesirable echoes and of the free induction decay is critical for the quality of the spatial resolution. This occurs through additional magnetic field gradients 24 that are switched in such a way that the magnetization is again fully rephased from the target volume at the time of the data acquisition, the magnetization of the remaining sample volume on the other hand is completely dephased.

FIG. 3 shows a flow chart of an embodiment of the inventive method.

In the first step of this embodiment of the method, S1, five echo signals $E_1$ through $E_5$ are measured, such as with the multi-echo STEAM pulse sequence shown in FIG. 2. A frequency spectrum is created by means of a Fourier transformation for each of these echo signals $E_1$ through $E_5$.

In the second step S2, one or more peak values (peaks) are recorded in the first frequency spectrum, which is created proceeding from the echo signal $E_1$, the echo being measured with the shortest echo time $TE_1$. In the case of the other frequency spectra a peak value is likewise sought or recorded with the help of the position (in the case of that frequency) at which a peak value is recorded in the first frequency spectrum.

In the third step S3, a relaxation time T2 is determined for each peak value that is recorded in the first frequency spectrum. To this end, an integration is carried out in all five frequency spectra at the position (frequency) at which the respective peak value is recorded in the first frequency spectrum in order to effectively determine the area covered by the respective peak value. This integration is carried out over a predefined integration interval (frequency interval). As a result, five areas are determined for each peak value, wherein the area becomes all the smaller, the greater the echo time TE of the corresponding echo signal. Proceeding from five points, wherein each point is defined by the echo time and by the corresponding area determined by means of integration, an exponential function is determined, which proceeds through these five points. With the help of this exponential function the relaxation time T2 can then be determined for the respective peak value.

In the fourth step S4, the relaxation time T2 determined for each peak value is assigned to one of the three substances (water, fat or silicone) with the use of the following table, as a result of which the corresponding peak value is also assigned to the corresponding substance.

TABLE 1

| Resonance frequency difference and T2 for water, fat and silicone | | | |
|---|---|---|---|
| | Resonance frequency difference to the resonance frequency of silicone (ppm) | T2 (ms) for 1.5 T | T2 (ms) for 3.0 T |
| Water | 4.6 | 70-140 | 60-140 |
| Fat | 1.3 | 50-60 | 50-60 |
| Silicone | 0 | 200 | <200 |

With the use of Table 1 one recognizes that the relaxation times T2 for water, fat and silicone do not overlap, so that an assignment of the relaxation time T2 determined in the third step of the method, S3, to a substance should be possible without great problems.

By means of the query F1 a distinction is made between a first case, in which one only peak value is recorded, and a second case, in which several peak values are recorded.

In the first case, the inventive method in this embodiment branches to the fifth step S5, in which the only peak value is assigned to the corresponding substance (water, fat or silicone). The frequency measured for the peak value corresponds to the measured resonance frequency of the assigned substance.

In the second case, a branch is made to the second query F2. In the event of this query F2, the program checks whether the differences between the frequencies that are measured for the several peak values can be brought into harmony (reconciled) with the resonance frequency differences shown in Table 1. If for example two peak values are recorded and the frequencies measured for these exhibit a difference of 4.6 (±a specific tolerance limit (e.g. 10 or 20%)), it should be a matter of water and silicone, provided the frequency measured for water is greater than the frequency measured for silicone is. If, in the case of the second query F2 the resonance frequency differences indicated in Table 1 cannot be brought into harmony with the measured frequencies, a branch is made to a sixth step S6, in which a warning message is output and manual input is requested. If, instead, as a result of the second query F2 the resonance frequency differences given in Table 1 can be brought into harmony with the measured frequencies, a branch is made to the fifth step S5, in which a corresponding substance is assigned to each peak value.

Although modifications and changes may be suggested by those skilled in the art, it is the intention of the inventors to embody within the patent warranted hereon all changes and modifications as reasonably and properly come within the scope of their contributions to the art.

We claim as our invention:

1. A method for frequency calibration of a magnetic resonance system with respect to a volume section of an examination subject containing an unknown number of substances, said method comprising:

operating a plurality of components of a magnetic resonance data acquisition unit in order to excite nuclear spins in a volume section of an examination subject by irradiating said volume section with radio-frequency (RF) pulses;

detecting, at respectively different times after exciting said nuclear spins, a plurality of echo signals from the volume section that arise in said volume section due to said excitation of said nuclear spins;

supplying said echo signals to a computerized processing system and, in said computerized processing system, automatically determining, for each of said echo signals, spectral information;

in said computerized processing system, detecting at least one peak value in the respective spectral information for each of the echo signals;

in said computerized processing system, automatically determining, for each peak value, a relaxation time of the nuclear spins that produced the respective echo signals from which the respective peak volume was detected;

in said computerized processing system, for each peak value, determining a substance associated therewith dependent on the relaxation time identified for the respective peak value; and from said computerized processing system, implementing a frequency adjustment of at least one of said plurality of components of said magnetic resonance data acquisition unit operated to excite said nuclear spins, dependent on the peak value determined for at least one of said substances, for implementing another excitation of said nuclear spins in said volume section of said examination subject.

2. A method as claimed in claim 1 comprising, in said computerized processing system, detecting multiple peak values in the respective spectral information of each of said echo signals, and, for each peak value, determining a substance associated therewith dependent on a resonance frequency difference based on the chemical shift associated with the respective substance.

3. A method as claimed in claim 2 comprising exciting said nuclear spins in said volume section of said examination subject by operating said plurality of components of said magnetic resonance data acquisition unit according a multi-echo STEAM sequence that comprises said RF pulses.

4. A method as claimed in claim 2 wherein said plurality of echo signals comprise a first echo signal and, in said computerized processing system, determining at least one peak value in the spectral information of said first echo signal and determining a frequency for each peak value in said spectral information of said first echo signal, and using said peak value determined for said first echo signal as respective peak values in subsequent echo signals in said plurality of echo signals in order to localize a frequency associated with the respective peak value.

5. A method as claimed in claim 2 comprising, in said computerized processing system, determining the respective peak values based on an assumption that said plurality of substances comprise at least one of water, fat and silicone.

6. A method as claimed in claim 2 wherein said volume section of said examination subject is a first volume section, among a plurality of volume sections, of said examination subject, and, for each volume section in said plurality of volume sections, determining respective peak values for respective substances corresponding to identification of the peak values of the respective substances in said first volume section, and implementing said frequency adjustment using the respective peak values for the respective substances in all of said plurality of volume sections.

7. A method as claimed in claim 1 comprising exciting said nuclear spins in said volume section of said examination subject by operating said plurality of components of said magnetic resonance data acquisition unit according a multi-echo STEAM sequence that comprises said RF pulses.

8. A method as claimed in claim 1 wherein said plurality of echo signals comprise a first echo signal and, in said computerized processing system, determining at least one peak value in the spectral information of said first echo signal and determining a frequency for each peak value in said spectral information of said first echo signal, and using said peak value determined for said first echo signal as respective peak values in subsequent echo signals in said plurality of echo signals in order to localize a frequency associated with the respective peak value.

9. A method as claimed in claim 1 comprising, in said computerized processing system, determining the respective peak values based on an assumption that said plurality of substances comprise at least one of water, fat and silicone.

10. A method as claimed in claim 1 wherein said volume section of said examination subject is a first volume section, among a plurality of volume sections, of said examination subject, and, for each volume section in said plurality of volume sections, determining respective peak values for respective substances corresponding to identification of the peak values of the respective substances in said first volume section, and implementing said frequency adjustment using the respective peak values for the respective substances in all of said plurality of volume sections.

11. A magnetic resonance imaging system comprising:
a magnetic resonance data acquisition unit;
a control unit configured to operate a plurality of components of said magnetic resonance data acquisition unit in order to excite nuclear spins in a volume section of an examination subject by irradiating said volume section with radio-frequency (RF) pulses;

said control unit being configured to operate said magnetic resonance data acquisition unit to detect, at respectively different times after exciting said nuclear spins, a plurality of echo signals from the volume section that arise in said volume section due to said excitation of said nuclear spins;

a computerized processing system, supplied with said echo signals, configured to automatically determine, for each of said echo signals, spectral information;

said computerized processing system being configured to detect at least one peak value in the respective spectral information for each of the echo signals of the nuclear spins that produced the respective echo signals from which the respective peak volume was detected;

said computerized processing system being configured to automatically determine, for each peak value, a relaxation time;

said computerized processing system being configured, for each peak value, to automatically determine a substance associated therewith dependent on the relaxation time identified for the respective peak value; and said computerized processing system being configured to implement a frequency adjustment of at least one of said plurality of components of said magnetic resonance data acquisition unit operated to excite said nuclear spins, dependent on the peak value determined for at least one of said substances, in order to implement another excitation of said nuclear spins in said volume section of said examination subject.

12. A magnetic resonance imaging system as claimed in claim 11 wherein said computerized processing system is configured to detect multiple peak values in the respective spectral information of each of said echo signals, and, for each peak value, to determine a substance associated therewith dependent on a resonance frequency difference based on the chemical shift associated with the respective substance.

13. A non-transitory, computer-readable data storage medium encoded with programming instructions, said programming instructions, when said data storage medium is loaded into a computerized control and evaluation system of a magnetic resonance system that comprises a data acquisition unit, cause said control and evaluation system to:

operate a plurality of components of a magnetic resonance data acquisition unit in order to excite nuclear spins in a volume section of an examination subject by irradiating said volume section with radio-frequency (RF) pulses;

detect, at respectively different times after exciting said nuclear spins, a plurality of echo signals from the volume section that arise in said volume section due to said excitation of said nuclear spins;

determine, for each of said echo signals, spectral information;

detect at least one peak value in the respective spectral information for each of the echo signals;

determine, for each peak value, a relaxation time of the nuclear spins that produced the respective echo signals from which the respective peak volume was detected;

for each peak value, determine a substance associated therewith dependent on the relaxation time identified for the respective peak value; and implement a frequency adjustment of at least one of said plurality of components of said magnetic resonance data acquisition unit operated to excite said nuclear spins, dependent on the peak value determined for at least one of said substances, in order to implement another excitation of said nuclear spins in said volume section of said examination subject.

14. A data storage medium as claimed in claim 13 wherein said programming instructions cause said computerized control and evaluation system to:

detect multiple peak values in the respective spectral information of each of said echo signals, and, for each peak value, determine a substance associated therewith dependent on a resonance frequency difference based on the chemical shift associated with the respective substance.

* * * * *